US 6,703,703 B2

(12) United States Patent
Grant

(10) Patent No.: US 6,703,703 B2
(45) Date of Patent: Mar. 9, 2004

(54) LOW COST POWER SEMICONDUCTOR MODULE WITHOUT SUBSTRATE

(75) Inventor: William Grant, Fountain Valley, CA (US)

(73) Assignee: International Rectifier Corporation, El Segundo, CA (US)

(*) Notice: Subject to any disclaimer, the term of this patent is extended or adjusted under 35 U.S.C. 154(b) by 177 days.

(21) Appl. No.: 09/758,822

(22) Filed: Jan. 11, 2001

(65) Prior Publication Data

US 2001/0030362 A1 Oct. 18, 2001

Related U.S. Application Data

(60) Provisional application No. 60/175,802, filed on Jan. 12, 2000.

(51) Int. Cl.[7] .............................................. H01L 23/48
(52) U.S. Cl. .................. 257/688; 257/680; 257/687; 257/693; 257/709; 257/730; 257/712
(58) Field of Search ................... 257/680, 687, 688, 693, 709, 730, 712

(56) References Cited

U.S. PATENT DOCUMENTS

| | | | | |
|---|---|---|---|---|
| 3,936,864 A | * | 2/1976 | Benjamin | 174/52.4 |
| 4,172,261 A | * | 10/1979 | Tsuzuki et al. | 257/706 |
| 4,649,416 A | * | 3/1987 | Borkowski et al. | 174/52.4 |
| 4,695,858 A | * | 9/1987 | Takezawa et al. | 250/239 |
| 4,985,753 A | * | 1/1991 | Fujioka et al. | 257/700 |
| 5,001,299 A | * | 3/1991 | Hingorany | 174/52.4 |
| 5,036,381 A | * | 7/1991 | Lin | 257/685 |
| 5,258,647 A | * | 11/1993 | Wojnarowski et al. | 257/687 |
| 5,315,486 A | * | 5/1994 | Fillion et al. | 174/253 |
| 5,371,405 A | * | 12/1994 | Kagawa | 257/259 |
| 5,559,374 A | | 9/1996 | Ohta et al. | 257/723 |
| 5,677,567 A | * | 10/1997 | Ma et al. | 257/666 |
| 5,744,752 A | * | 4/1998 | McHerron et al. | 174/52.4 |
| 6,105,226 A | * | 8/2000 | Gore et al. | 174/52.3 |
| 6,313,598 B1 | | 11/2001 | Tamba et al. | 318/722 |

FOREIGN PATENT DOCUMENTS

| | | |
|---|---|---|
| JP | 06-283639 | 10/1994 |
| JP | 10-93015 | 4/1998 |
| JP | 11-274358 | 10/1999 |
| JP | 2000-91499 | 3/2000 |
| JP | 2001-85613 | 3/2001 |

* cited by examiner

Primary Examiner—Eddie Lee
Assistant Examiner—Eugene Lee
(74) Attorney, Agent, or Firm—Ostrolenk, Faber, Gerb & Soffen, LLP

(57) ABSTRACT

A power module for low voltage applications, which does not include an insulated metal substrate is disclosed. The module includes a power shell and a plurality of lead frames each lead frame including a conductive pad on which one or more MOSFETs may be electrically mounted. The MOSFETs are electrically connected via wire bonds.

16 Claims, 4 Drawing Sheets

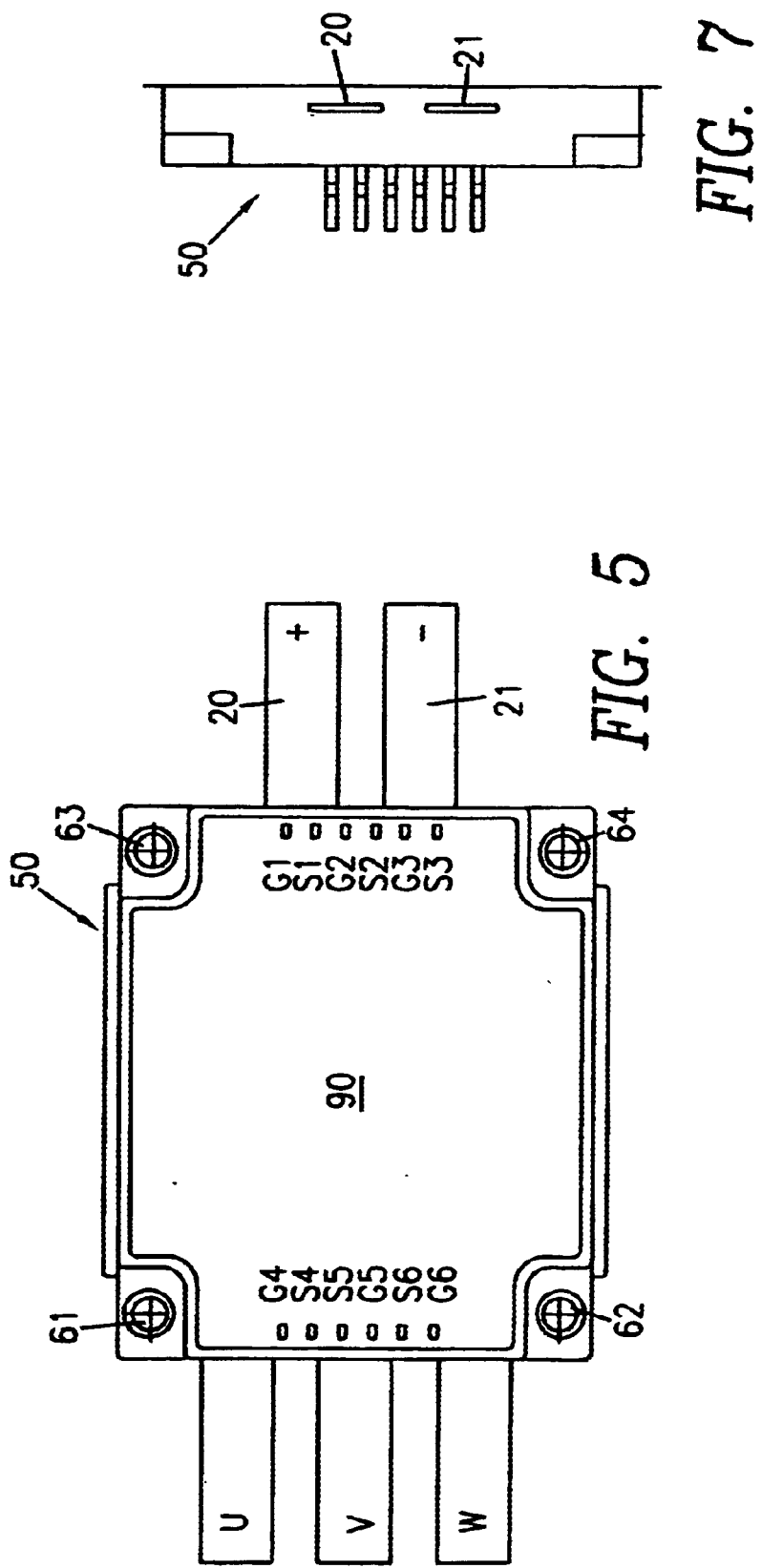

LOW COST POWER SEMICONDUCTOR MODULE WITHOUT SUBSTRATE

PRIORITY STATEMENT

This application relates and claims priority to a United States provisional application, Ser. No. 60/175,802, entitled Low Cost Power Semiconductor Module Without Substrate, filed in the United States Patent and Trademark Office on Jan. 12, 2000.

BACKGROUND OF THE INVENTION

This invention relates to power modules and more specifically relates to a low cost 3 phase inverter module which has no substrate for the power semiconductor die.

Power semiconductor modules are well known and are widely used. Typically, a plurality of semiconductor die, such as MOSgated devices, thyristors or diodes in various combinations are mounted on a substrate heatsink, such as an IMS (insulated metal substrate) or other substrate and are electrically connected through the substrate, and/or by wire bonds, to form a particular circuit. A printed circuit board containing low power control components is also supported by the module. Power and control terminals may then extend from an insulation housing which carries the substrate.

Substrates used to carry the power die constitute a significant part of the cost of power modules, and therefore they are limited to the smallest possible area. It would be desirable to reduce the cost of such modules while permitting appropriate thermal management and electrical insulation.

SUMMARY OF THE INVENTION

In accordance with the invention, the power die are mounted directly on lead frame extensions of a lead frame which is insert molded within and supported by the module insulation housing. A heat conductive insulation layer underlies the lead frame elements to insulate it from a heat sink support for the module. No added IMS or other substrate is used, thus reducing the cost of the module.

In a preferred embodiment, the module is a three phase inverter circuit for automotive application for example, for electric power steering motors. However, any other desired circuit can be provided.

BRIEF DESCRIPTION OF THE DRAWINGS

FIG. 5 is a top view of the module of FIG. 4.

FIG. 6 is a side view of FIG. 5.

FIG. 7 is an end view of FIG. 5.

DETAILED DESCRIPTION OF THE DRAWINGS

Figure 8:
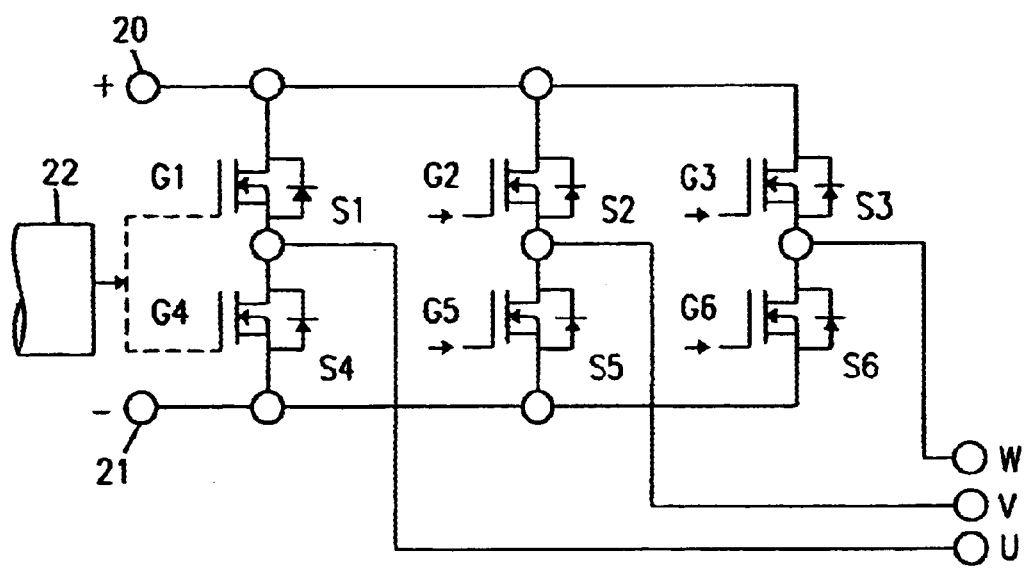
FIG. 8 is a circuit diagram of an exemplary module circuit which can be formed by the module.

Referring first to FIG. 8, there is shown an exemplary electrical circuit diagram of a 3 phase inverter circuit which could have application to automotive uses particularly to electric power steering. Thus, terminals 20 and 21 are d-c terminals which could be connected to the automobile battery and output terminals U, V and W are 3 phase output terminals which can be used to power ac motors, or, with suitable rectification, dc motors, such as dc brushless motors, that are typically found within the automotive system. A conventional three phase inverter circuit is shown. An ASIC 22 and other control circuit components for the MOSFETs $S_1$ to $S_6$ is also provided to operate power MOSFETS $S_1$ to $S_6$ in a conventional sequence. The instant invention is particularly suited for low voltage applications. The die of the present invention are rated from 30 to 75 volts and are size 4.0 to 6 die as sold by the International Rectifier Corporation.

While power MOSFETs $S_1$ to $S_6$ are shown as N channel devices, complementary N and P channel MOSFETs could be used.

In conventional modules, the circuit of FIG. 8 is commonly formed by employing unpackaged MOSFET die which are mounted on an IMS or DBC substrate and interconnected through the substrate and by wire bonds. The substrate would then be mounted within an insulation housing and terminals, such as the terminals 20, 21, U, V, W and $G_1$ to $G_6$ would extend beyond the housing surface to be available for connection.

The substrate used to mount the die within the housing according to conventional modules is expensive. In accordance with the invention, this substrate is eliminated, with the die mounted directly on the lead frame extensions of the terminals. Note that any circuit other than an inverter can be formed, and that any type of die or mix of die, such as N and P channel MOSFETs or IGBTS, diodes, thyristors and the like can be used and enjoy the benefits of the invention.

FIGS. 1 to 7 show a preferred embodiment of the invention for housing the 3 phase inverter circuit of FIG. 8. Note that the same identifying numeral or letter is used in all drawings to identify the same part.

Figure 1:
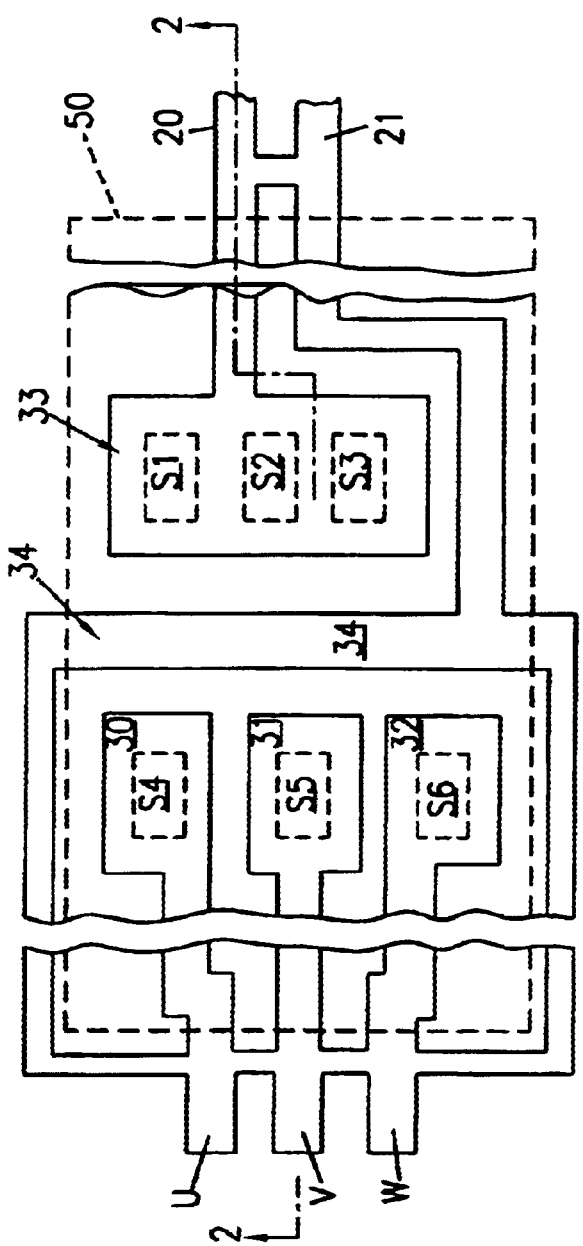
FIG. 1 is a top view of a lead frame which can be used with the present invention.
Figure 2:
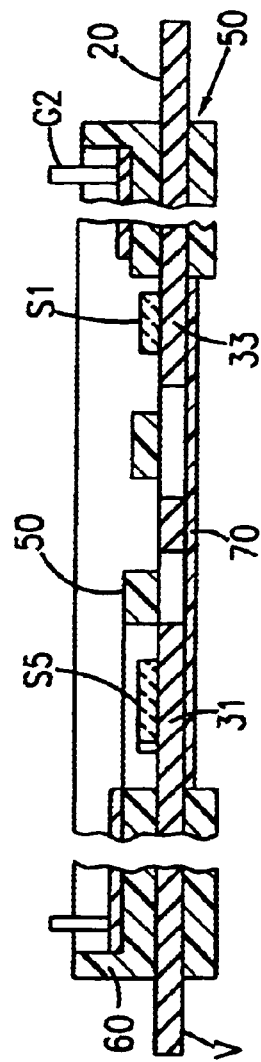
FIG. 2 is a cross-section of the lead frame of FIG. 1 taken across section line 2—2 in FIG. 1.

FIG. 1 shows one segment of an elongated conductive, stamped lead frame which can be used with the invention. A plurality of such segments are provided in the usual manner. The various segments of the lead frame are held together by webs which will be stamped out after parts are mounted on the lead frame and wire bonded and the lead frame segments are singulated. One half of the lead frame provides terminals U, V and W which are connected to large pad areas 30, 31 and 32 respectively. These pads 30, 31 and 32 will receive the MOSFET die S4, S5 and S6 respectively. The other half of the lead frame has terminals 20 and 21 and a common drain pad 33. Terminal 21 is also connected to a source pad area 34. Die S1, S2 and S3 are connected to pad 33. Die S1 to S6 are vertical conduction MOSFET die having metallized bottom drain electrodes and a top source and gate electrode. The bottom drain electrodes may be soldered or otherwise connected, as by a silver loaded conductive epoxy, to the enlarged lead frame pad regions 30, 31, 32 and 33.

Figure 3:
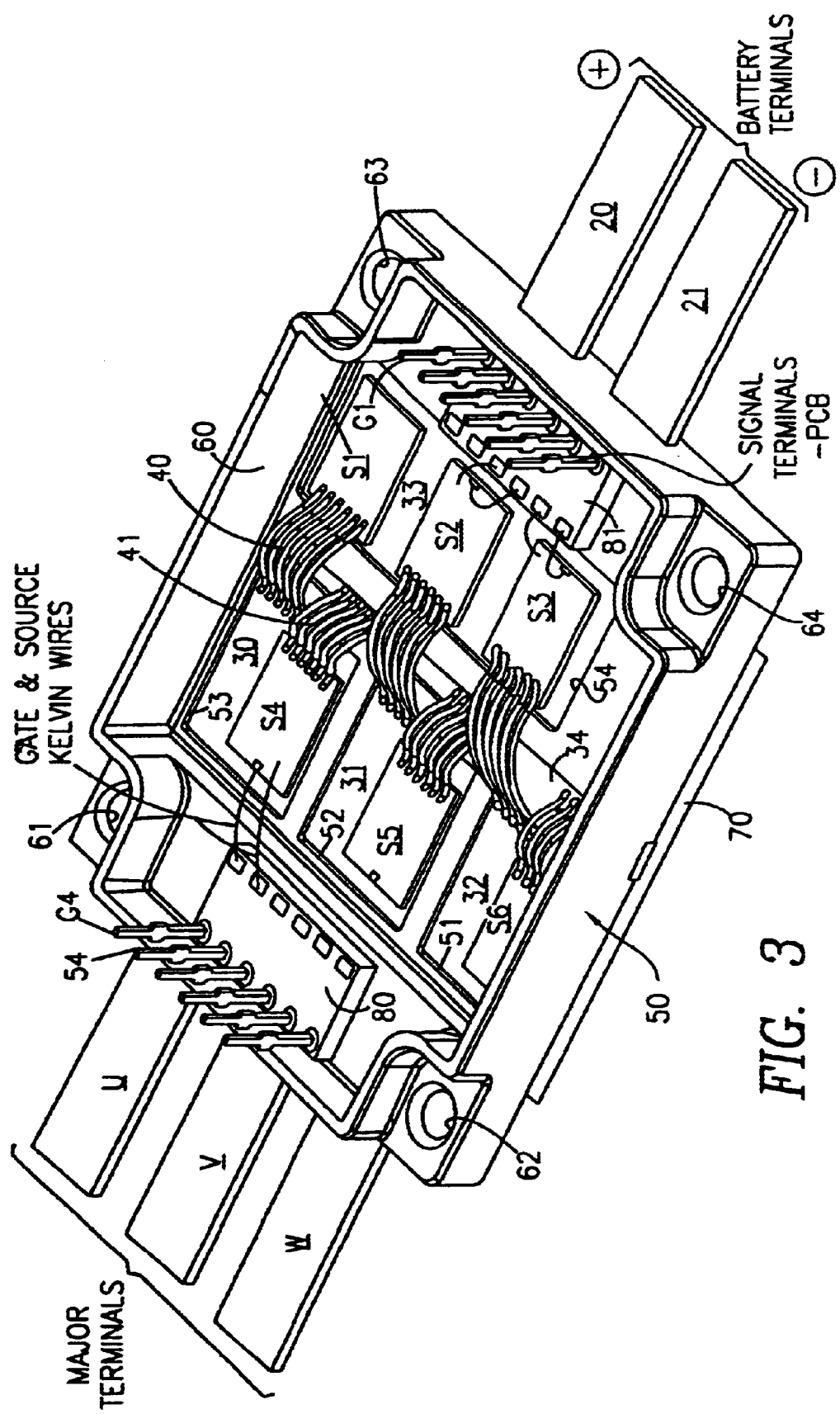
FIG. 3 is a perspective view of the module of the invention, before its interior is sealed with insulation plastic.
Figure 4:
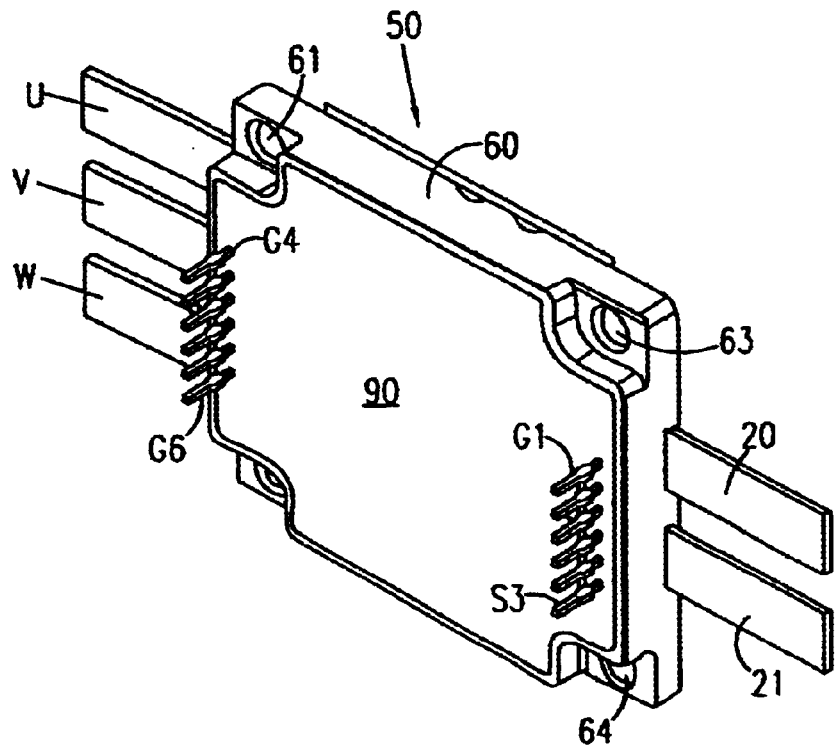
FIG. 4 is another perspective view of the module of the invention after its interior is filled.

After the die S1 to S6 are fixed in place, they may be wire bonded, as shown in FIG. 3 to complete the circuit of FIG. 8. Thus, as shown in FIG. 3, source bond wires 40 connect the pads 30, 31 and 32 to the source electrodes of die S1, S2 and S3 respectively; and source bond wires 41 connect the source electrodes of die S4, S5 and S6 to pad 34 and d-c terminal 21. Note that these bonds can be made after mounting of the lead frame in its housing.

Thus, after the die S1 to S6 are bonded to their various lead frame pads, the lead frame is insert molded in an insulation housing 50 and the lead frame bridging sections (exterior of the dotted line in FIG. 1) are removed to separate the pads from one another and the lead frames are singulated. The lead frame is insert molded within and are supported by the housing 50 after lead frame trimming, with conductors U, V, W, 20 and 21 extending beyond the periphery of housing 50. Housing 50 is preferably a thermally conductive insulation material which can electrically isolate conductive lead frame pads and a heat sink on which it is mounted from one another. Housing 50 may be a QUESTRA plastic made by DOW chemical, or a suitable PPA such as the one made by Amoco and sold under the mark AMODEL.

Housing 50 will have windows 51, 52, 53 and 54 to expose the top surfaces of pads 32, 31, 30 and 33 respectively to provide access to die S1 to S6 for the die bonding operation. A rim 60 is integral with and surrounds the housing 50 and bolt-down openings 61, 62, 63, 64 are provided at the housing corners. A bottom layer 70 of a thin insulation material extends fully across the bottom of the housing 50 and acts to electrically isolate the pads 30, 31, 32, 33 and 34 from one another and from the users heat sink on which the housing is mounted. Note that lead frame pads act to conduct thermal energy generated by the die S1 to S6 through the lead terminals and to the thermally conductive insulation layer, which may be placed in contact with a heat sink. A large percentage of the thermal energy, approximately 80.1, is dissipated through the thermally conductive insulation layer, and the remainder may be dissipated through the lead terminals.

As next shown in FIG. 3 printed circuit boards 80 and 81 which carry control terminals G1 to G6 (FIGS. 4 and 5) and related Kelvin (source) terminals and wire bond terminals therefor are fixed to the top opposite platform end surfaces of the housing 50 and appropriate wire bonds can be made.

After all wire bonds are made, the interior of rim 60 of housing 50 may be filled by a suitable silastic 90 (FIGS. 4 and 5), or an epoxy or the like.

Note that the module of FIGS. 1 to 7 has no separate substrate for receiving the die S1 to S6 and, therefore has a reduced expense.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

I claim:

1. A power module for low voltage applications, comprising:
    a molded insulation housing having an open top and bottom and having an enclosed rim;
    a lead frame containing a plurality of coplanar conductive pads and conductive leads connected thereto;
    the lead frame conductive leads being insert molded within the enclosed rim with the conductive pads and extending beyond the exterior surface of said rim and supporting the lead frame pads interiorly of the rim;
    a plurality of wire bonds for electrically inter-connecting the power semiconductor devices through the conductive pads to form a circuit;
    the bottom surfaces of the lead frame conductive pads being substantially coplanar and being mountable on a heat sink support which is separate from said module; and
    wherein the power semiconductor devices consist of MOSFETs in a three phase bridge connection.

2. The module of claim 1, wherein the circuit is a three phase inverter circuit.

3. The module of claim 1, wherein the MOSFETs are rated between thirty and seventy-five volts.

4. The module of claim 1, wherein a control circuit board is mounted atop an enlarged area of the rim for providing signals to the power semiconductor devices.

5. The module of claim 1, wherein the interior of the rim above the plane of the lead frame is filled with potting material.

6. The module of claim 5, wherein the housing is a molded plastic.

7. The power module of claim 1 wherein each of said MOSFETs have a drain electrode on their bottom surface and a source and gate electrode on their upper surface; the plurality of conductive pads including first, second and third pads insulated from one another and connected to first, second and third parallel conductive leads respectively which extend through and are insert molded in the rim; a fourth lead frame pad connected to a fourth conductive lead and a fifth conductive lead extending parallel to the fourth conductive lead, with the fourth and fifth conductive leads extending through and being insert molded in said rim; a first group of three of said MOSFETs being conductively connected at their drain electrodes to the first, second and third pads; a second group of three of the MOSFETs being conductively connected at their drain electrodes to said fourth pad; the source electrode of the second group of MOSFETs being wire bonded to said fifth conductive lead.

8. The module of claim 7, wherein the MOSFETs are inter-connected to form a three phase inverter circuit.

9. The module of claim 7, wherein the MOSFETs are rated between thirty and seventy-five volts.

10. The power module of claim 4, further comprising at least one terminal providing electrical connection to the circuit board, the at least one terminal being electrically connected to at least one of the power semiconductor devices.

11. The power module of claim 1, wherein a thermally conductive, electrically insulating layer is interposed between the lead frame conductive pads and the heat sink.

12. A power module for low voltage applications, comprising:
    a molded insulation housing having an open top and bottom and having an enclosed rim;
    a lead frame containing a plurality of coplanar conductive pads and conductive leads connected thereto;
    the lead frame conductive leads being insert molded within the enclosed rim with the conductive pads and extending beyond the exterior surface of said rim and supporting the lead frame pads interiorly of the rim; and
    a plurality of wire bonds for electrically inter-connecting MOSFETs in a three phase bridge connection through the conductive pads to form a circuit;
    the bottom surfaces of the lead frame conductive pads being substantially coplanar and being mountable on a heat sink support which is separate from said module.

13. The module of claim 12, wherein the MOSFETs are rated between thirty and seventy-five volts.

14. The power module of claim 12 wherein each of said MOSFETs have a drain electrode on their bottom surface and a source and gate electrode on their upper surface; the plurality of conductive pads including first, second and third pads insulated from one another and connected to first, second and third parallel conductive leads respectively which extend through and are insert molded in the rim; a fourth lead frame pad connected to a fourth conductive lead and a fifth conductive lead extending parallel to the fourth conductive lead, with the fourth and fifth conductive leads extending through and being insert molded in said rim; a first group of three of said MOSFETs being conductively connected at their drain electrodes to the first, second and third pads; a second group of three of the MOSFETs being conductively connected at their drain electrodes to said fourth pad; the source electrode of the second group of MOSFIETs being wire bonded to said fifth conductive lead.

15. The module of claim 14, wherein the MOSFETs are inter-connected to form a three phase inverter circuit.

16. The module of claim 14, wherein the MOSFETs are rated between thirty and seventy-five volts.

* * * * *